US006251487B1

United States Patent
Yonaha

(10) Patent No.: US 6,251,487 B1
(45) Date of Patent: Jun. 26, 2001

(54) METHOD FOR COATING A RESIST FILM

(75) Inventor: Shinya Yonaha, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/387,199

(22) Filed: Aug. 31, 1999

(30) Foreign Application Priority Data

Sep. 4, 1998 (JP) .................................. 10-250804

(51) Int. Cl.[7] .................................................. B05D 1/02
(52) U.S. Cl. ........................ 427/425; 427/240; 427/385.5
(58) Field of Search .................... 427/240, 425, 427/385.5; 118/52, 320

(56) References Cited

U.S. PATENT DOCUMENTS

| 4,600,597 | * | 7/1986 | White et al. ............................. 427/9 |
| 4,741,926 | | 5/1988 | White et al. ........................... 427/240 |
| 4,748,053 | | 5/1988 | Okada et al. ......................... 427/240 |
| 5,238,878 | * | 8/1993 | Shinohara ............................. 437/231 |
| 5,250,116 | * | 10/1993 | Tanimoto ............................... 118/664 |
| 5,393,624 | * | 2/1995 | Ushijima ................................. 430/30 |
| 5,773,082 | * | 6/1998 | Ku et al. ............................... 427/240 |
| 5,820,677 | * | 10/1998 | Yonaha ................................. 118/680 |

FOREIGN PATENT DOCUMENTS

| 3-245875 | 11/1991 | (JP) | ................................. B05D/1/40 |
| 7-275780 | 10/1995 | (JP) | ............................... B05C/11/08 |
| 8-255789 | 10/1996 | (JP) | ................................ H01L/21/31 |
| 10-154650 | 6/1998 | (JP) | ............................. H01L/21/027 |
| 10-156273 | 6/1998 | (JP) | ................................. B05D/1/40 |

* cited by examiner

Primary Examiner—Shrive Beck
Assistant Examiner—Jennifer Calcagni
(74) Attorney, Agent, or Firm—Hayes, Soloway, Hennessey, Grossman & Hage, PC

(57) ABSTRACT

A resist film having a thickness of 5500 Å or less is coated on the wafer having a large diameter of 8 inches or more by the spin coat process. A resist is dripped while allowing the wafer to be rotated at a rotation speed of 500 rpm to 1200 rpm and the dripping of the resist is suspended at the time of spreading the resist on the whole surface of the wafer. The rotation speed is raised to the predetermined rotation speed which regulates the thickness of the resist film and is determined from the correlation of the predetermined rotation speed and the thickness of the resist film. The wafer is rotated for 1 second to 5 seconds at the predetermined rotation speed. Then, the wafer is rotated for 15 seconds or more at the rotation speed which is lower than the predetermined rotation speed.

6 Claims, 8 Drawing Sheets

METHOD FOR COATING A RESIST FILM

BACKGROUND OF THE INVENTION

1. Field of the Invention

The present invention relates to a coating method and a resist coater for coating a resist film on a wafer. More particularly, the invention relates to a coating method and a resist coater for coating a resist film having a thickness of 5500 Å or less on a wafer having a large diameter of 8 inches or more by a spin coating process, wherein the resist film is free from unevenness in the coating of the resist film and favorable in an in-plane evenness in film thickness and film quality. Incidentally, the resist film in this specification refers to a wide concept including a photoresist film.

2. Description of the Related Art

In a manufacturing process of a semiconductor device, when patterning is performed by etching, a resist film mask having a desired pattern Is formed on a layer to be etched, and the layer is etched by the use of the mask.

A resist film for forming a mask is normally formed on a layer to be etched by coating a resist on a wafer using a resist coater and baking the resist.

By the way, according to a higher integration of a semiconductor device, each elements in the semiconductor device including wirings is made more and more fine. In the generation of the fine pattern rule of 0.35 µm or less, the thickness of a resist film which is coated on a wafer is made thinner and thinner for reasons in the etching processing. In particular, in an resist coating process which requires a coating of a reflection preventing film, in order to secure evenness in film thickness and prevent generation of unevenness in reflection as can be seen in pin holes, it is required to set the thickness of the reflection preventing film to 2000 Å or more.

On the other hand, in order to improve precision in dry etching for a resist resolution pattern, and in order to prevent the neighboring resist patterns from being connected, it is required to set the total thickness of the reflection preventing film and the resist film to 7000 Å or less. Consequently, it is inevitably required to set the thickness of the resist film to 5500 Å or less.

Before explaining a conventional coating method, a resist coater for coating a resist on a wafer will first be explained with reference to FIG. 1. FIG. 1 is a sectional view showing a structure of a conventional resist coater of a spin coat type.

As shown in FIG. 1, a resist coater 10 has a wafer holding table 12 for rotating a wafer W around an axis which is perpendicular to the wafer W while holding the wafer W with a wafer surface thereof directed upwardly. A resist supply nozzle 14 supplies resist to the wafer W which is held on the wafer holding table 12. A coater cup 16 surrounds the wafer holding table 12 and the resist supplying nozzle 14.

The wafer holding table 12 is attached on an upper end of a rotation shaft 18 which penetrates a bottom portion of the coater cup 16 and which is rotated with a rotation device (not shown). The wafer holding table 12 is provided on its wafer holding surface with a chuck mechanism for vacuum-sucking the wafer W, and it is rotated together with the rotation shaft 18 around an axis which is perpendicular to the wafer holding surface.

The coater cup 16 is provided for trapping resist particle which are scattered from the wafer W by a centrifugal force due to rotation of the wafer W, and the coater cup 16 has an outer cup 20 for trapping resist particles which are scattered in a sidewise and an upward directions, and an inner cup 22 for guiding resist particles which are scattered in a downward direction from the wafer W to a bottom portion of the outer cup 20.

The outer cup 20 has at an upper portion thereof an opening 24 for introducing the resist supply nozzle 14 or the like, and for taking in and taking out the wafer W. Furthermore, the inner cup 22 is provided on a lower portion of the outer cup 20, and the inner cup 22 has a cylindrical portion 22a, and an umbrella portion 22b which spreads toward the inside of the coater cup 16 from an upper opening thereof.

The resist supply nozzle 14 is lowered from the above via the opening 24 of the coater cup 16, and is arranged at a position facing a resist coating surface of the wafer W. Also, in order to clean an edge to the back surface of the wafer W, a first cleaning nozzle 26 for spraying rinse agent is provided to be directed toward the edge of the back surface of the wafer W through the bottom portion of the coater cup 16. Furthermore, in order to clean an edge of the surface of the wafer W, a second cleaning nozzle 28 for spraying rinse agent is provided to be directed toward the edge of the wafer W via the upper opening 24 of the coater cup 16.

Exhaust pipes 30 connected to an exhaust device (not shown) for exhausting the inside of the coater cup 16, and a drain pipe 32 for exhausting the resist trapped in the coater cup 16 are connected to the bottom portion of the coater cup 16.

Following, a conventional method for coating a resist film by the use of the above-mentioned resist coater 10 will be explained by giving an example of forming a resist film having a thickness of 5500 Å on an 8 inch wafer. FIG. 2 is a graph showing a rotating speed of a wafer of each step in the conventional method.

When a resist film having a thickness of 5500 Å or less, for example, 5000 Å, is coated on an 8 inch wafer, the coating process is conventionally performed in the following procedure.

Resist having, for example, a relatively low viscosity on the order of 7 cp is used for a resist film. The wafer is held on the wafer holding table 12 and the resist is first dripped on a wafer from the resist supply nozzle 14 while rotating the wafer at a low rotation speed of 1000 rpm, and the resist is spread on the whole surface of the resist coating surface of the wafer for 4 seconds.

Next, the dripping of resist is suspended, and the wafer is rotated for 19 seconds at a rotation speed of 5000 rpm, so that a resist film having a desired thickness, i.e., of 5000 Å is formed.

Subsequently, rinse agent is sprayed from the first cleaning nozzle 26 for 20 seconds, and the back surface edge of the wafer is cleaned. Also, rinse agent is sprayed from the second rise nozzle 28, and the surface edge of the wafer is cleaned. Thus, the coating step is terminated.

Subsequently, the process proceeds to the following baking step, where the residual solution in the resist is completely removed.

However, in the case where a resist film having a thickness of 5500 Å or less on a 8 inch or more wafer in accordance with the conventional coating method, an in-plane unevenness regarding film thickness and film quality are not favorable, so that variations occur in film thickness and film quality. For example, when a high speed rotational coating is performed on an 8 inch or more wafer, variations in the resist film thickness occur in the in-plane of the wafer in a range of 90 Å or more.

As a consequence, problems are caused in a photolithography stop and an etching step which follow the coating step. For example, there arise a problem that unevenness occurs in wiring width which is obtained in the etching, which results in difficulty in improvement in product yield.

Specifically, on a wafer having a large diameter of 8 inches or more, when the wafer is rotated for 20 seconds or more at a rotation speed of 5000 rpm after dripping the resist agent, a coating unevenness occurs and generated at a constant cycle on a peripheral portion of the wafer having a width of 20 mm from an outer periphery thereof inwardly. For example, in an example according to the method described above, the coating unevenness occurs on the peripheral portion of the wafer, and a variation in the resist film thickness is caused between a central portion of the wafer and the peripheral portion thereof due to the coating unevenness. Thus, as shown in FIG. 3, variations in the fill thickness exceeding 100 Å are generated within the in-plane of the wafer.

With respect to a 6 inch wafer, for reference, even when the wafer is rotated for 20 seconds or more at a rotation speed of 6000 rmp after dripping the resist agent on the wafer, it never happens that the coating unevenness occurs in the peripheral portion of the wafer.

SUMMARY OF THE INVENTION

Therefore, an object of the present invention is to provide a coating method where a resist film favorable in in-plane evenness in film thickness and film quality is coated on a wafer without generation of coating unevenness around a peripheral thereof, even when the wafer has a large diameter and to provide a resist coater for coating such a resist film on the wafer.

In order to attain the above object, the method for coating the resist film according to the present invention is given as a method for coating a resist film having a thickness of 5500 Å A or less on a wafer having a large diameter of 8 inches or more by the spin coat process of coating a resist on a wafer by allowing the wafer to be rotated around an axis which is perpendicular to the surface of the wafer.

The method comprises the following steps.

Firstly, a predetermined amount of the resist is dripped on a wafer while allowing the wafer to be rotated at a rotation speed of 500 rpm to 1200 rpm. The dripping of the resist is suspended at the time when the resist is spread on the whole surface of the wafer. This step is called as a first step.

Secondly, the rotation speed of the wafer is raised from the rotation speed at the first step to a predetermined rotation speed of the wafer which is determined from a correlation of the predetermined rotation speed of the wafer which regulates the thickness of the resist film and the wafer is allowed to be rotated at the predetermined rotation speed for 1 second to 5 seconds. This step is called as a second step.

Thirdly, the rotation speed is lowered from the rotation speed at the second step and the wafer is allowed to be rotated at a rotation speed which is lower than said predetermined rotation speed of the wafer at the second step for 15 seconds or more. This step is called a third step.

In the present invention, in the beginning, at the first step, the resist is spread on the whole surface of the wafer by allowing the wafer to be rotated at a low rotation speed while dripping the resist on the wafer in the same manner as the convention method.

At the second step, the thickness of the resist film is set to a predetermined thickness by allowing the wafer to be rotated at a predetermined rotation speed for a time as short as possible, namely for 1 second to 5 seconds in order to suppress the generation of unevenness in the coating of the resist film in the peripheral portion of the wafer under the influence of the air flow and the air resistance. Said predetermined rotation speed of the wafer differs depending on the characteristics of the resist film which is to be coated. In advance, a relationship shown, for example, in FIG. 4 is determined as a relationship between the thickness of the resist film and the predetermined rotation speed of the wafer in the experiments or the like. From such a relationship, said predetermined rotation speed of the wafer is determined in accordance with the predetermined thickness of the resist film.

At the third step, the wafer is rotated for a relatively long tine at a rotation speed at which no unevenness in the coating of the resist film is generated in the peripheral portion of the wafer, namely, at a rotation speed which it lower than the predetermined rotation speed of the wafer, preferably, at a rotation speed approximate to the predetermined rotation speed of the wafer with the result that the evenness within the surface in the film thickness and the film quality of the resist film is heightened.

Preferably, time of 1 second to 5 seconds which is regulated as a period of the second step includes time of the transition from the first step to the second step. As a consequence, the generation of the unevenness in the coating of the resist film in the peripheral portion of the wafer can be suppressed with more certitude.

An organic resist having a high fluidity and a low viscosity of 40 cp or less, more preferably, 10 cp or less may be preferably used as the resist, and the predetermined rotation speed at the second step may be set to 4300 rpm to 6000 rpm. Furthermore, at the third step, the wafer is rotated at a rotation speed ranging from 3800 rpm to 4200 rpm. As a consequence, the generation of the unevenness in the coating of the resist film in the peripheral portion of the wafer can be prevented with more certitude, and the evenness within the surface in the film thickness and the film quality of the wafer can be more heightened.

As a resist having a viscosity of 40 cp or less which is used in the present invention, for example, a trade name PAG manufactured by Tokyo Ohka Kogyo Co., Ltd. (main ingredient of the solvent; nitro-benzyl-tocylate) or a trade name PGMEA (a main ingredient of the solvent; MEA) can be used.

Furthermore, in practical applications, after the third step, there is provided a fourth step of rinsing the edge of the surface and the edge of the back surface of the wafer while allowing the wafer to be rotated at a rotation speed which is lower than the rotation speed at the third step.

More preferably, as time required for the first step and the fourth step, time of 10 seconds to 15 seconds, and time of 10 seconds to 20 seconds are set respectively. A sequence from the first step to the fourth step is programmed, and a coating process is automatically carried out in accordance with the program.

As a consequence, since the same coating procedure can be applied with respect to a large number of wafers, the generation of the unevenness of the film thickness and the film quality for each of the wafers can be prevented.

In accordance with the method of the present invention, the wafer is rotated for 1 second or more to 5 seconds or less at a predetermined rotation speed of the wafer which is determined from a correlation of the predetermined rotation speed of the wafer which regulate the thickness of the resist film at the second step, followed by coating the resist film having a thickness of 5000±50 Å on an 8 inch wafer while preventing the generation of unevenness in the coating of the resist film and maintaining an evenness within the surface in the film thickness and the film quality by allowing the wafer to be rotated for 15 seconds or more at a rotation speed which in lower than the predetermined rotation speed of the wafer at the third step.

A resist coater according to the present invention is a device for coating a resist film on a wafer by the spin coat process. The resist coater comprises: a wafer holding table for holding the wafer while setting the surface of the wafer in an upward direction and rotating the wafer around an axis which is perpendicular to the wafer; a resist supply nozzle for supplying the resist on the wafer which is held on the wafer holding table; and a coater cup surrounding the wafer holding table and the resist supply nozzle. The coater cup is of a tightly sealed type and is connected to a pressure reducing device for reducing a pressure within the coater cup.

The resist coater according to the present invention is such that the coater cup is of a tightly sealed type, and air and a resist solvent within the coater cup is absorbed by absorbing the inside of the coater cup and reducing the pressure therein with a device for reducing pressure with the result that air density becomes thin and the influence of the air flow and air resistance is reduced.

As a consequence, the generation of the unevenness in the coating of the resist film in the peripheral portion of the wafer can be largely suppressed, and a favorable evenness within the surface in the film thickness and the film quality can be maintained.

Preferably, a back surface cleaning nozzle for rinsing the edge of the back surface of the wafer and a surface cleaning nozzle for ringing the edge of the surface of the wafer are provided therein.

Furthermore, the coater cup is divided into two portions; an upper cup and a lower cup. The upper cup and the lower cup are connected to each other but which are separable.

In the case where the coater cup is divided into two portions, preferably, the resist supply nozzle and the surface cleaning nozzle are connected to the upper cup via flexible pipes, and faces to an appropriate portion of the surface of the wafer through the upper cup while the back surface cleaning nozzle passes through the lower cup and faces to an appropriate portion of the back surface of the wafer.

As a consequence when the wafer is held on the wafer holding stage, it is easy and possible that the upper cup is separated from the lower cup, and the wafer is held on the wafer holding stage, followed by connecting the upper cup to the lower cup again.

The upper cup can be connected to the lower cup by a known clamp connection, a bolt-nut connection, a quick coupling connection or a screw connection providing a ring-like gasket between them.

In accordance with the resist coater of the present invention, the coater cup is formed in a tightly-sealed type and is connected to a pressure reducing device for reducing the pressure in the coater cup with the result that the influence of the air flow and the air resistance can be reduced thereby realizing a resist coater which can prevent the generation of the unevenness in the coating of the resist film in the peripheral portion of the wafer and, at the same time, which device can maintain the evenness within the surface in the film thickness and the film quality.

DESCRIPTION OF THE PREFERRED EMBODIMENTS

Figure 1:
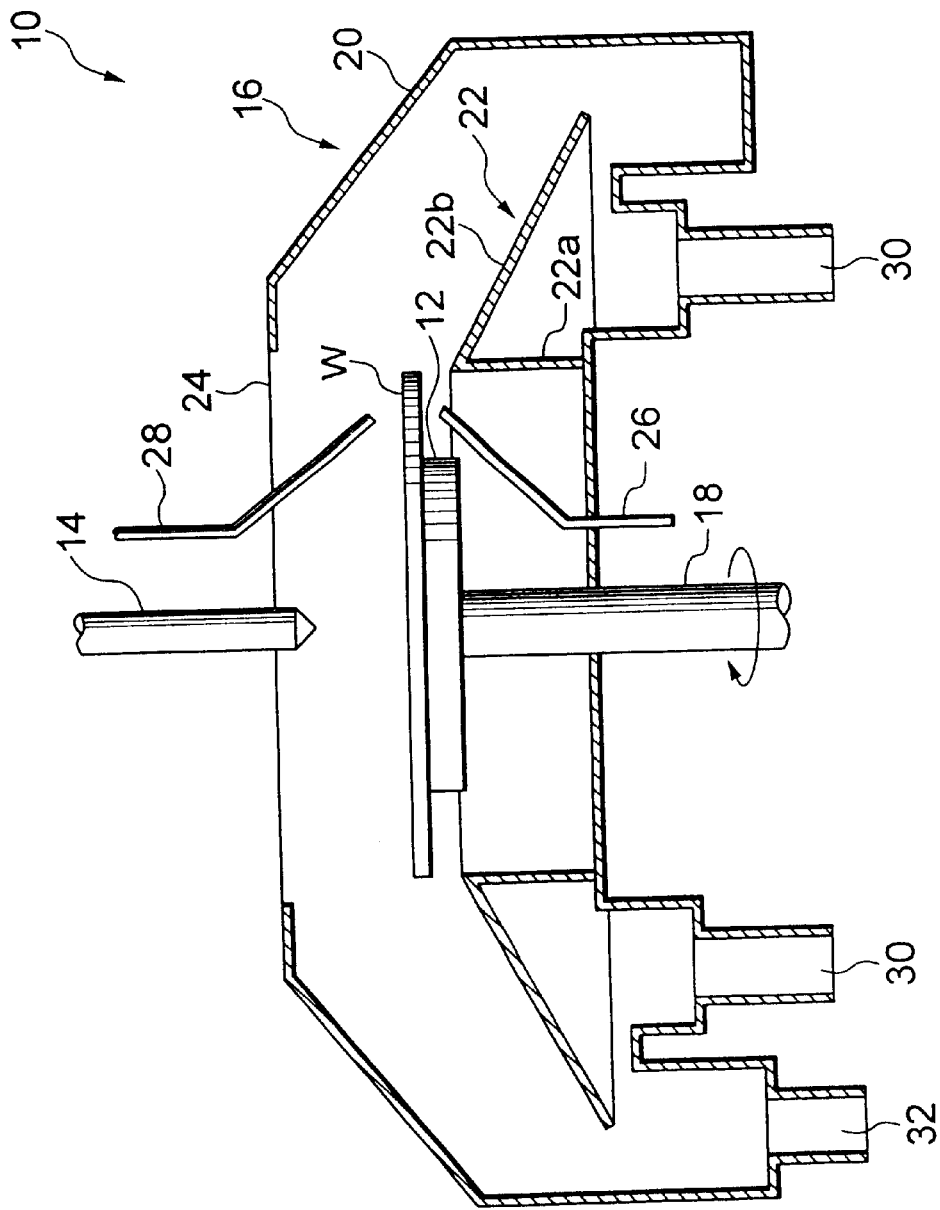
FIG. 1 is a sectional view showing a structure of a conventional resist coater for coating a resist film.
Figure 2:
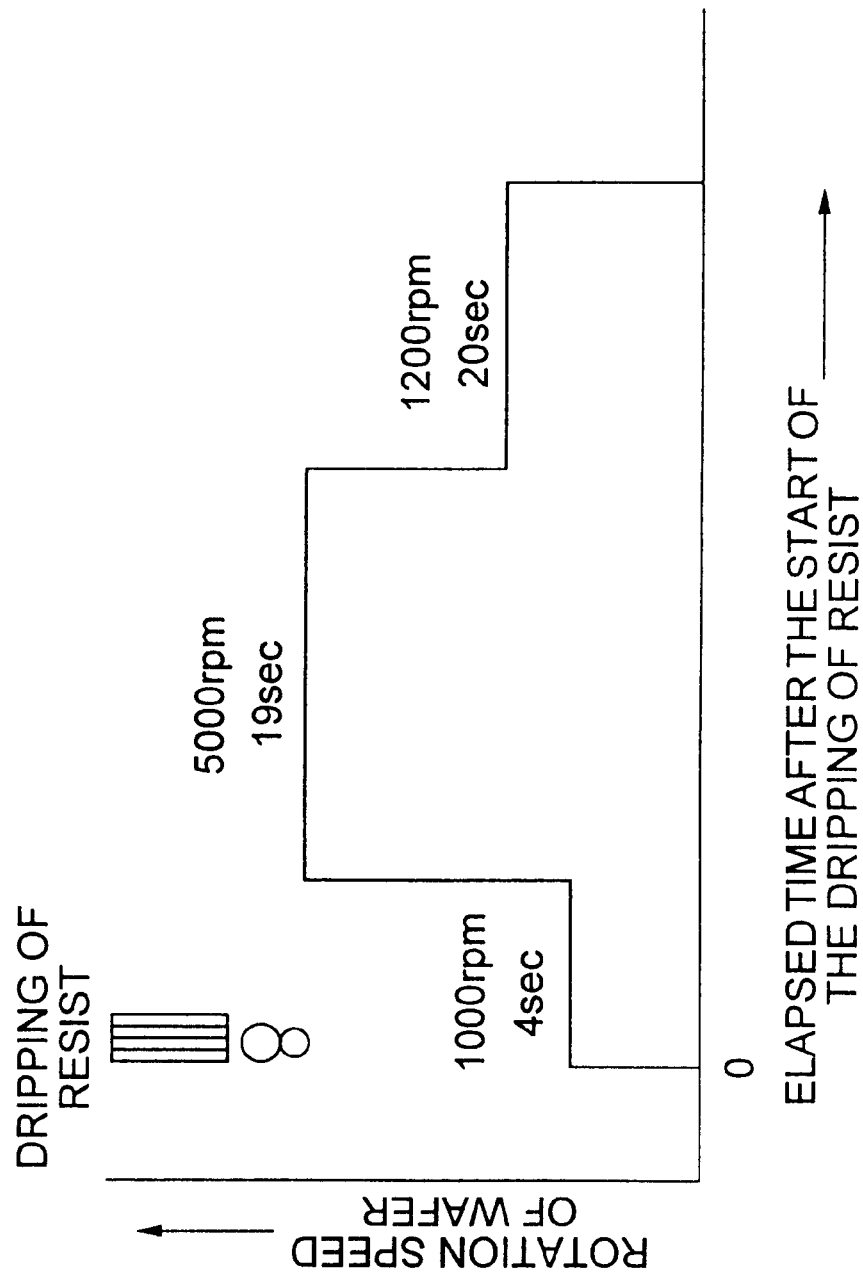
FIG. 2 is a graph showing a rotating speed of a wafer of each step in the conventional method.
Figure 3:
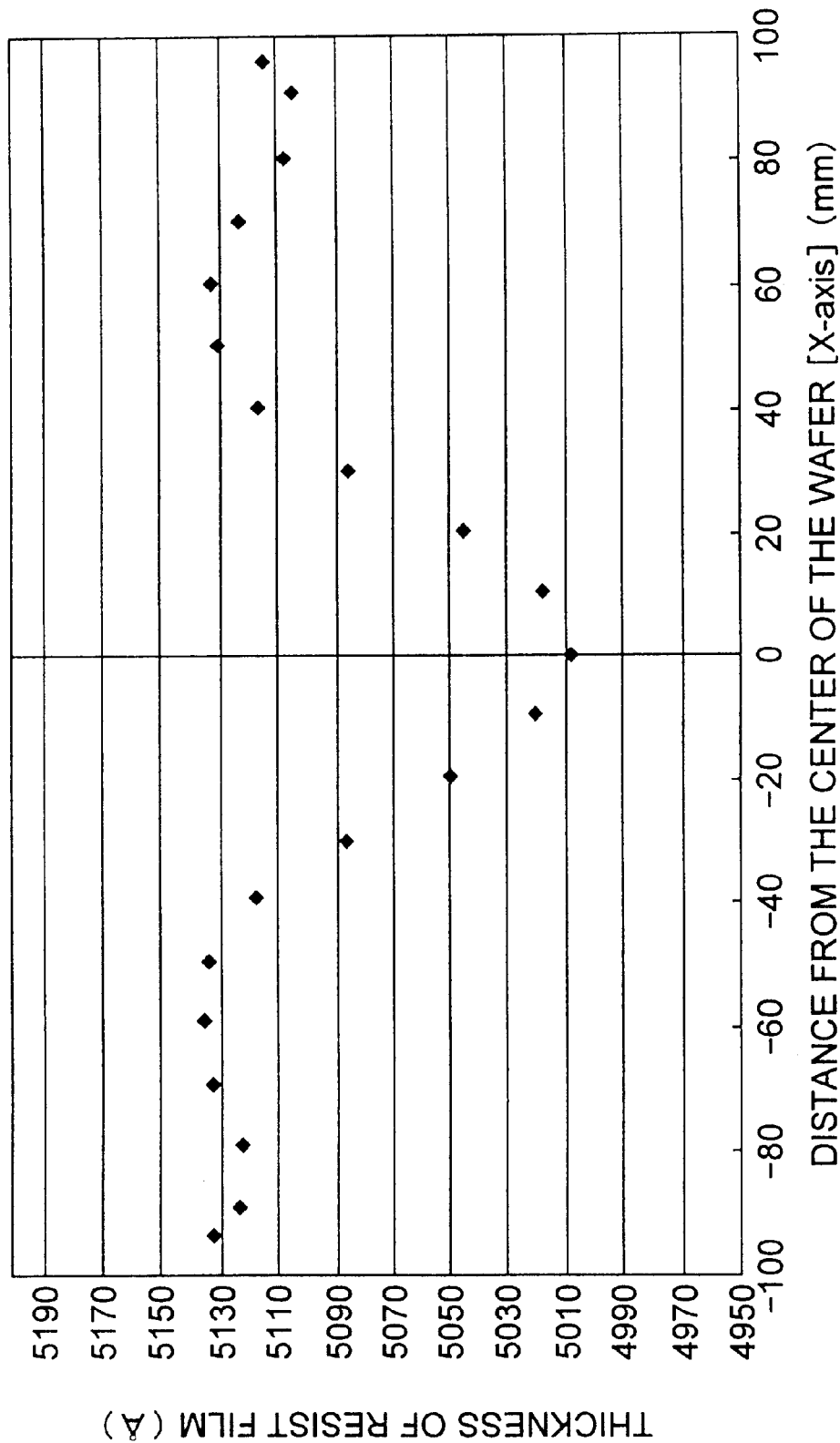
FIG. 3 is a graph showing a variation in the film thickness within the surface of the photoresist film which variation is obtained in the conventional method.
Figure 4:
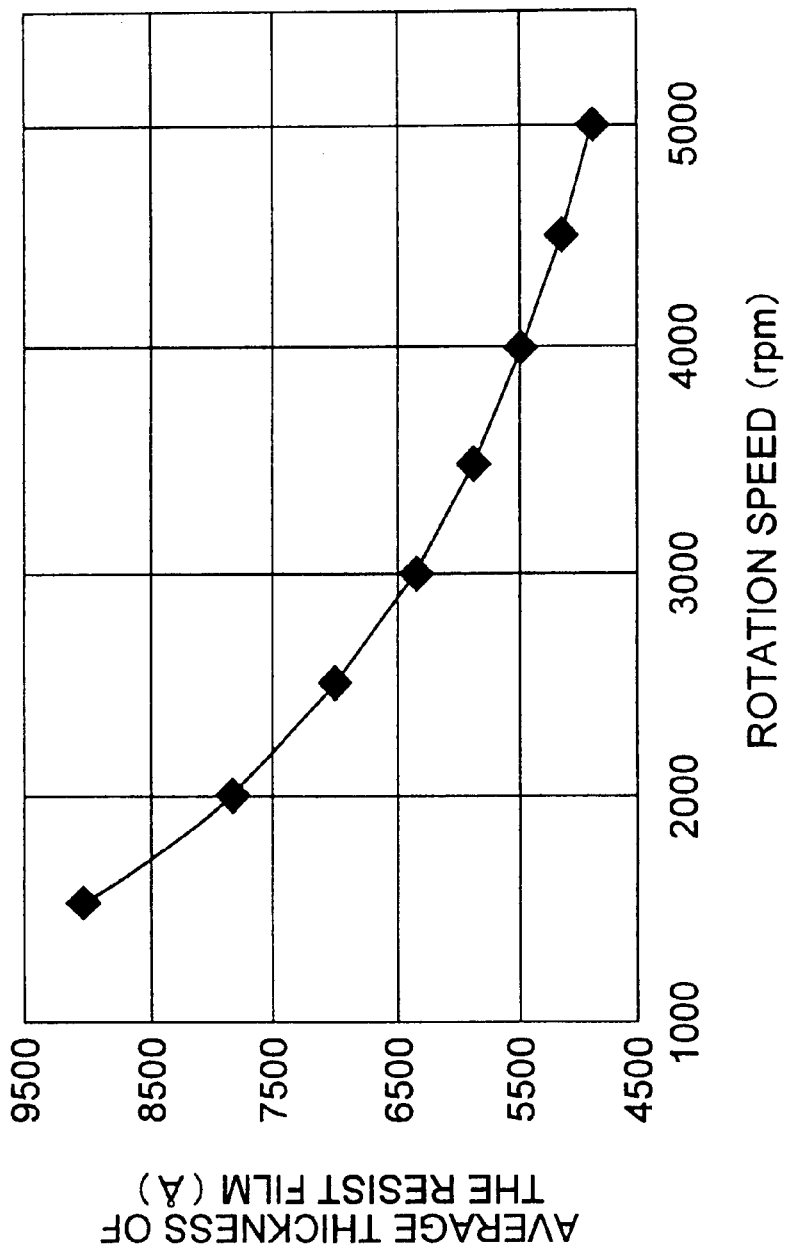
FIG. 4 is a graph showing a relationship between the thickness of the resist film and the predetermined rotation speed of the wafer.

Hereinbelow, a preferred embodiment of the present invention will be described in detail by referring to accompanied drawings.

The inventors of the present invention have found the following points as a result of an investigation of a cause for the deterioration of in-pane unevenness within the surface in film thickness and the film quality in an attempt of coating a resist film having a thin thickness on a wafer having a large diameter of 8 inches or more.

(1) when the wafer is rotated at a high speed of 4300 rpm or more, the flow and spreading of the resist on the wafer is affected by an air flow within a coater cup with the result that a smooth flow and spreading of the resist is prevented. In other words, a linear speed at a peripheral portion of the wafer becomes extremely high. As a consequence, the air within the coater cup becomes an air flow or a vortex with a friction between the peripheral portion of the wafer and the air. With such air flow and friction resistance with the air, the smooth flow and spreading of the resist on the wafer is prevented with the result that a large coating unevenness and a film thickness unevenness is generated.

(2) The thickness of the resist having a low viscosity of 40 cp or less largely depends on the rotation speed of the wafer during a short period immediately after the dripping of the resist, namely the rotation speed during 3.0 seconds to 5.0 seconds after the dripping of the resist, and the rotation speed immediately after the dripping of the resist regulates the thickness of the resist film. Consequently, a predetermined thickness of the resist film can be obtained by rotating the wafer for a short time immediately after the dripping of the resist, for 1.0 second to 5.0 seconds at a predetermined rotation speed which regulates the predetermined thickness of the resist film.

On the contrary, even when the wafer continues to be rotated for more than ten seconds at a rotation speed at which the air flow or the air resistance affect a little on the flow and spreading of the resist, for example, at a rotation speed of 400 rpm or less in order to suppress the generation of the coating unevenness and the unevenness in the thickness of the resist film, it is impossible to obtain a thin resist film of a thickness of 5500 Å or less.

(3) The evenness within the surface in the film thickness and the film quality can be maintained by allowing the wafer to be rotated at a predetermined rotation speed which regulates the film thickness after the dripping of the resist, which is followed by allowing the wafer to be rotated at a rotation speed which is lower than the predetermined rotation speed.

On the basis of the findings described above, the inventors of the present invention have completed the present invention which will be explained hereinbelow after repeating many experiments.

Embodiment of Method for Coating Resist Film

An embodiment is given as an example of embodying the method for coating the resist film on a wafer according to the present invention.

The method for coating the resist film on the wafer according to the present embodiment is a method for coating a resist film having a thickness of 5000 Å on an 8 inch wafer with the spin coat process by using the aforementioned conventional resist coater 10 for coating the resist film on the wafer and using an organic resist film having a viscosity of 40 cp or less.

In the beginning, at the first step, a predetermined amount of resist is dripped on the wafer while rotating the wafer at a rotation speed of 500 to 1200 rpm (first step in FIG. 5), followed by suspending the dripping of the resist at the time of spreading the resist on the whole surface of the wafer.

Subsequently, the process proceeds to the second step from the first step by raising the rotation speed. Then, the wafer is rotated for 1 second to 5 seconds at a rotation speed of 4300 rpm to 6000 rpm (second step in FIG. 5). Incidentally, the time of 1 second or more to 5 seconds or less which is regulated as the period of the second step includes time of transition from the first step to the second step.

The process proceeds to the third step from the second step by lowering the rotation speed. Then the wafer is rotated for 15 seconds or more at a rotation speed of 3800 rpm to 4200 rpm (third step in FIG. 5).

Subsequently, at the fourth step, the edge of the surface of the wafer and the edge of the back surface thereof are rinsed while allowing the wafer to be rotated at the rotation speed of 1000 rpm or more to 1500 rpm (fourth step in FIG. 5).

An experiment of coating the resist film is carried out under conditions which are basically the same as the aforementioned example of the embodiment in order to evaluate the method of the present invention. FIG. 5 is a graph showing a time schedule of each step in the present experiment.

In the present experiment, the resist coater 10 described above for coating the resist film on the wafer is used, and a resist manufactured by Tokyo Ohka Kogyo Co., Ltd. (having a viscosity of 10 cp) is used as a resist to coat the resist film on an 8 inch wafer.

Figure 5:
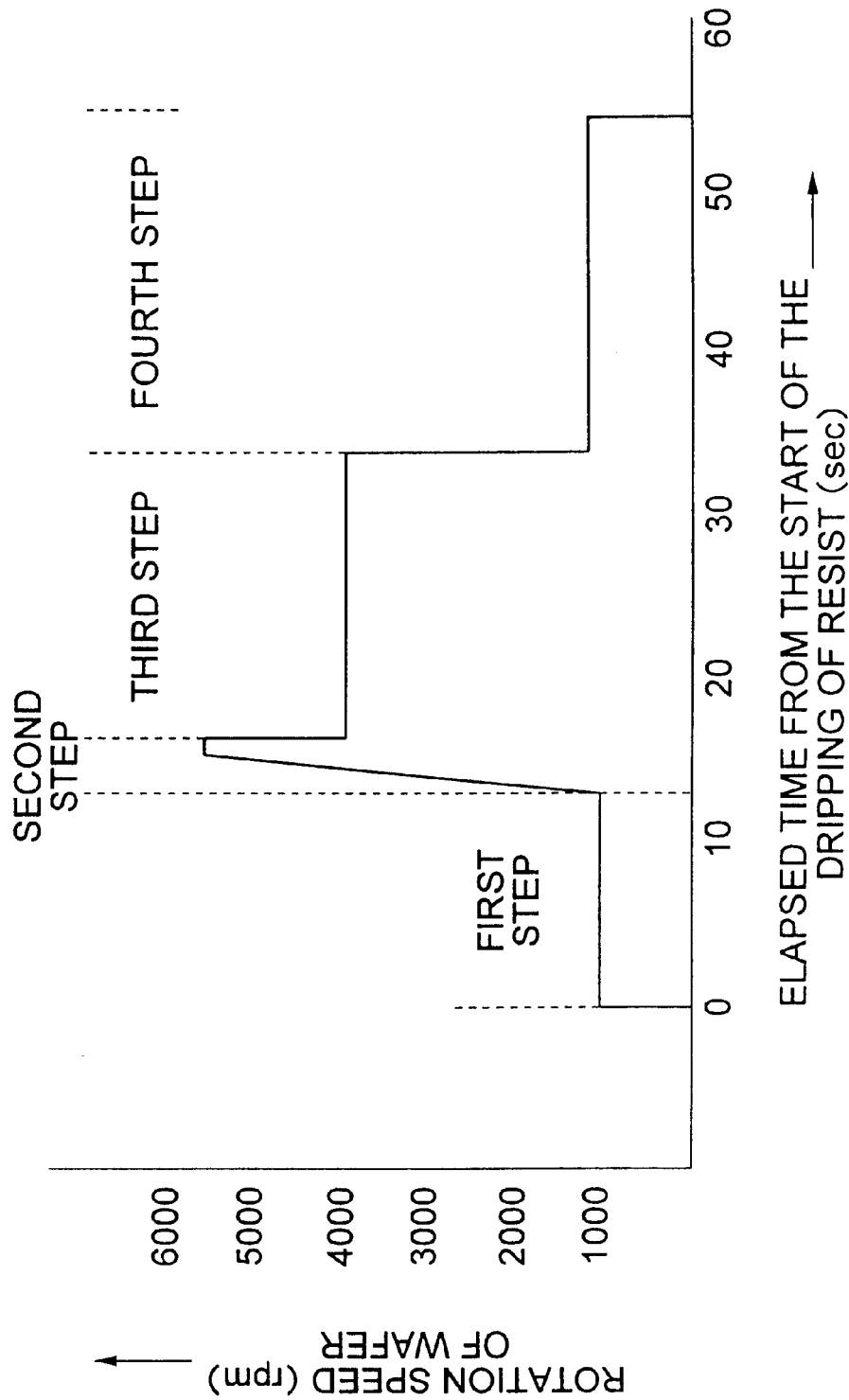
FIG. 5 is a graph showing a rotation speed of a wafer of each step in accordance with an embodiment of the present invention.

In the beginning, as the first step, a predetermined amount of resist is dripped on the wafer in 13 seconds as shown in FIG. 5 while the wafer is held on the wafer holding stage 12 of the resist coater 10 for coating on the wafer the resist film shown in FIG. 1, and the wafer is rotated at the rotation speed of 1000 rpm with the result that the resist is spread on the whole surface of the wafer.

Subsequently, after 13 seconds after the start of the dripping of the resist, the dripping of the resist is suspended. As the second step, the rotation speed of the wafer is raised to 5670 rpm in 2 seconds, and the rotation speed of 5670 rpm is maintained for 1 second.

Subsequently, the process proceeds to the third step, and the rotation speed of the wafer is lowered to 4000 rpm. Then, the rotation speed is held for 18 seconds.

At the fourth step, the rotation speed of the wafer is lowered to 1200 rpm for 0.5 second, and the edge of the back surface of the wafer and the edge of the surface thereof are rinsed for 20 seconds.

Then, the coated photoresist film is baked. And the thickness of the photoresist film is measured. The measured thickness is shown in FIG. 6.

Figure 6:
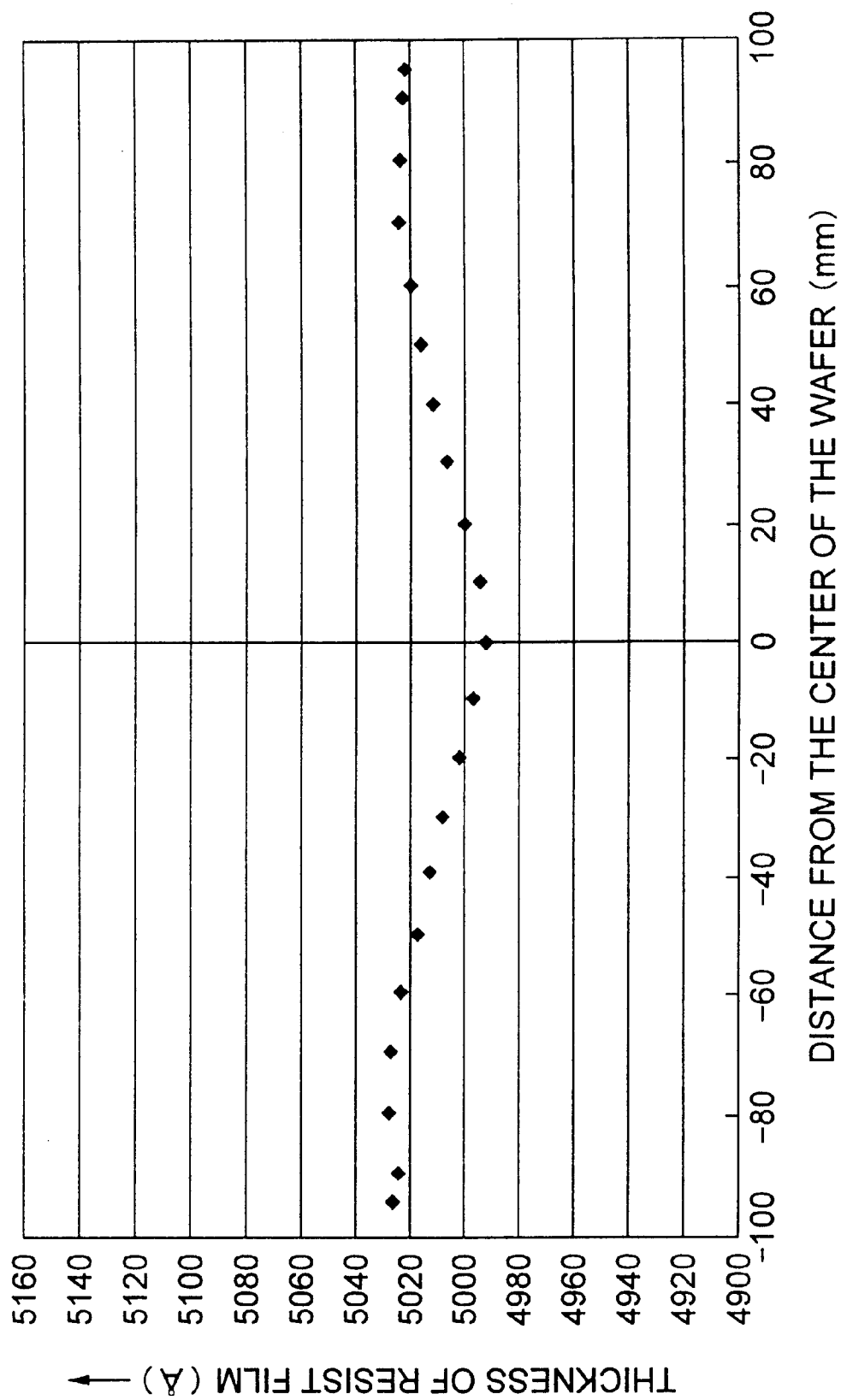
FIG. 6 is a graph showing an example of a variation in the film thickness within the surface of a photoresist film.

As can be seen in FIG. 6, a film thickness unevenness between the central portion of the wafer and the peripheral portion thereof was 40 Å at most.

In the present embodiment, an example in which the conventional resist coater is used for coating the resist film on the wafer is explained. Preferably, the resist coater of the present embodiment is used to prevent with certitude the generation of the unevenness in the coating of the resist film in the peripheral portion of the wafer, and the evenness within the surface in the film thickness and the film quality can be further improved.

Embodiment of Resist Coater for Coating Resist Film

Figure 7:
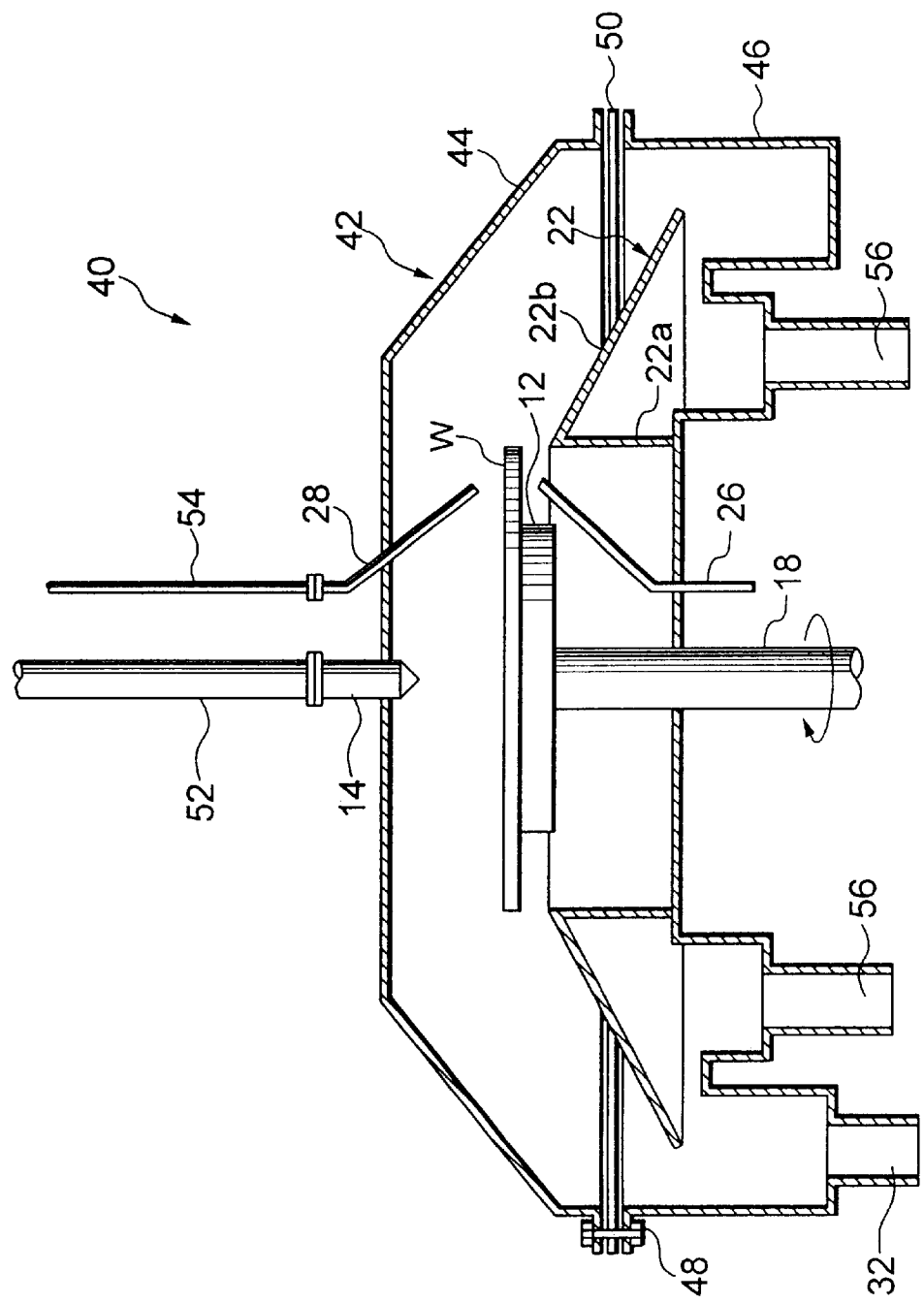
FIG. 7 is a sectional view showing a structure of a resist coater according to an embodiment.
Figure 8:
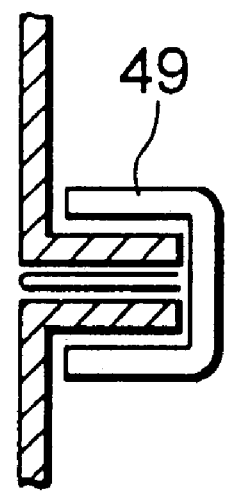
FIG. 8 is a sectional view showing a method for connecting an upper cup and a lower cup according to another embodiment.

The present embodiment is one example of the device for coating the resist film according to the present invention. FIG. 7 is a schematic sectional view showing a structure of the device for coating the resist film according to one embodiment of the present invention. FIG. 8 is a sectional view showing a connection method for connecting the upper cup and the lower cup according to another embodiment of the present invention.

The resist coater 40 for coating the resist film according to the embodiment of the present invention is provided with a tightly-sealed type of the coater cup 42 connected to a pressure reducing device.

The coater cup 42 is divided into two portions; an upper cup 44, and a lower cup 46. The upper cup 44 and the lower cup 46 both have a flange on a connection portion thereof, respectively. Both the upper cup 44 and the lower cup 46 are connected to each other by mutually connecting the flanges inserting a ring-like gasket 50 therebetween by means of the known quick style bolt and nut connection 49. The upper cup 44 and the lower cup 46 are separable by disconnecting the bolt and nut connection 48. Incidentally, as shown in FIG. 8, a clamp connection by means of a clamp 49 having a known structure can be used in the place of the bolt-nut connection 48.

The resist supply nozzle 14 and the second cleaning nozzle 28 are connected to the upper cup 44 via flexible tubes 52 and 54, respectively, pass through the upper cup 44 and face an appropriate portion on the wafer W.

Furthermore, the coater cup 42 is connected to the pressure reducing device (not shown) attached with a vacuum pump via an absorption port 56 provided on a bottom portion of the lower cup 46. In the process of coating the resist film on the wafer, the inside of the coater cup 42 is maintained in a pressure reduced state.

Except for the structure described above, the resist coater 40 for coating the resist film according to the embodiment of the present invention has the same structure as the conventional resist coater described above.

In the resist coater 40 for coating the resist film according to the present invention, the coater cup 42 is of a tightly sealed type, and the air and the resist solvent in the coater cup is withdrawn so that the gas density becomes thin and the influence of the air flow and the gas resistance is reduced.

As a consequence, at the time of coating the resist film on the wafer in accordance with the conventional method for coating the resist film, the generation of the unevenness in the coating of the resist film in the peripheral portion of the wafer can be largely reduced.

Incidentally, the generation of the unevenness in the coating of the resist film on the peripheral portion of the wafer can be largely suppressed, and the evenness within the surface in the film thickness and the film quality can be further improved by coating the resist film on the wafer by means of the method for coating the resist film in accordance with the present invention through the use of the resist coater 40 for coating the resist film in accordance with the embodiment of the present invention.

What is claimed is:

1. A coating method for a resist film wherein a resist film having a thickness of 5500 Å or less is coated on a wafer having a diameter of 8 inches or more by a spin coating process of coating a resist on a wafer by allowing the wafer to be rotated around an axis which is perpendicular to the surface of the wafer, the method comprising the steps of:

a first step of dripping a predetermined amount of the resist while allowing the wafer to be rotated at a rotation speed of 500 rpm to 1200 rpm and suspending the dripping of the resist at a time when the resist has been spread on the whole surface of the wafer;

a second step of raising the rotation speed of the wafer from the rotation speed at the first step to a predetermined rotation speed of the wafer and allowing the wafer to be rotated at the predetermined rotation speed for a time of between 1 and 5 seconds, wherein the predetermined rotation speed of the wafer is determined from an experimental relationship between the thickness of the resist film and the predetermined rotation speed of the wafer; and a third step of lowering the rotation speed from the rotation speed at the second step and allowing the wafer to be rotated at a rotation speed which is lower than the predetermined rotation speed of the wafer at the second step for a time of at least 15 seconds;

wherein prior to the first step the wafer is placed in a closed chamber and the air pressure within the chamber is reduced so that the influence of air flow and air resistance is reduced and an even resist film is obtained.

2. The coating method for a resist film according to claim 1, wherein said time of between 1 and 5 seconds which is defined as a period of the second step includes a time of transition from the first step to the second step.

3. The coating method for a resist film according to claim 1, wherein an organic resist having a viscosity of 40 cp or less is used, and the predetermined rotation speed at the second step is 4300 rpm to 6000 rpm.

4. The coating method for a resist film according to claim 3, wherein the wafer is rotated at a rotation speed ranging between 3800 rpm and 4200 rpm at the third step.

5. The coating method ;or a resist film according to claim 1, wherein there is provided after the third step a fourth step of rinsing the edge of the surface and the edge of the back surface of the wafer while allowing the wafer to be rotated at the rotation speed which is lower than the rotation speed at the third step.

6. The coating method for a resist film according to claim 5, wherein a time of between 10 and 15 seconds, and a time of between 10 and 20 seconds are set respectively as time required for the first step and the time required for the fourth step, and a sequence from the first step to the fourth step is programmed, and a process of coating the resist film is automatically performed in accordance with the program.

* * * * *